United States Patent
Lee et al.

(10) Patent No.: US 9,240,487 B2
(45) Date of Patent: Jan. 19, 2016

(54) METHOD OF MANUFACTURING THIN FILM TRANSISTOR AND METHOD OF MANUFACTURING ORGANIC LIGHT EMITTING DISPLAY HAVING THIN FILM TRANSISTOR

(75) Inventors: Hun-Jung Lee, Suwon-si (KR); Jae-Kyeong Jeong, Suwon-si (KR); Hyun-Soo Shin, Suwon-si (KR); Jong-Han Jeong, Suwon-si (KR); Jin-Seong Park, Suwon-si (KR); Steve Y. G. Mo, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 797 days.

(21) Appl. No.: 12/266,797

(22) Filed: Nov. 7, 2008

(65) Prior Publication Data

US 2009/0155940 A1 Jun. 18, 2009

(30) Foreign Application Priority Data

Dec. 18, 2007 (KR) ................ 2007-133508

(51) Int. Cl.
*H01L 21/00* (2006.01)
*H01L 29/786* (2006.01)
(Continued)

(52) U.S. Cl.
CPC ........ *H01L 29/7869* (2013.01); *H01L 29/4908* (2013.01); *H01L 29/786* (2013.01);
(Continued)

(58) Field of Classification Search
CPC ............ H01L 29/7869; H01L 27/3262; H01L 29/41733; H01L 21/02565; H01L 27/1251; H01L 29/786; H01L 29/4908; H01L 27/1222; H01L 29/78618

See application file for complete search history.

(56) References Cited

U.S. PATENT DOCUMENTS 4,772,927 A * 9/1988 Saito et al. ................ 257/66
7,829,444 B2 * 11/2010 Yabuta et al. ............. 438/483
(Continued)

FOREIGN PATENT DOCUMENTS

JP   P2002-289859 A   10/2002
JP   2004-273614      9/2004
(Continued)

OTHER PUBLICATIONS

Seung Yeop Myong and Koeng Su Lim, titled "Role of Intentionally Incorporated Hydrogen I Wide-Band-Gap ZnO Thin Film Prepared by Photo-MOCVD Technique", cP772, *Physics of Semiconductors; 27th International Conference on the Physics of Semiconductors.*
(Continued)

*Primary Examiner* — Bac Au
(74) *Attorney, Agent, or Firm* — H.C. Park & Associates, PLC

(57) ABSTRACT

A method of manufacturing a thin film transistor having a compound semiconductor with oxygen as a semiconductor layer and a method of manufacturing an organic light emitting display having the thin film transistor include: forming a gate electrode on an insulating substrate; forming a gate insulating layer on the gate electrode; forming a semiconductor layer including oxygen ions on the gate insulating layer, and including a channel region, a source region, and a drain region; forming a source electrode and a drain electrode to contact the semiconductor layer in the source region and the drain region, respectively; and forming a passivation layer on the semiconductor layer by coating an organic material, wherein a carrier density of the semiconductor layer is maintained in the range of $1E+17$ to $1E+18/cm^3$ to have stable electrical property.

12 Claims, 7 Drawing Sheets

(51) Int. Cl.
*H01L 29/49* (2006.01)
*H01L 27/12* (2006.01)
*H01L 29/417* (2006.01)
*H01L 27/32* (2006.01)
*H01L 21/02* (2006.01)

(52) U.S. Cl.
CPC ....... *H01L21/02565* (2013.01); *H01L 27/1222* (2013.01); *H01L 27/1251* (2013.01); *H01L 27/3244* (2013.01); *H01L 27/3262* (2013.01); *H01L 29/41733* (2013.01); *H01L 29/78618* (2013.01)

(56) References Cited

U.S. PATENT DOCUMENTS

| | | | | |
|---|---|---|---|---|
| 2007/0087487 | A1* | 4/2007 | Honda | 438/149 |
| 2007/0132365 | A1* | 6/2007 | Kang et al. | 313/500 |
| 2007/0241327 | A1* | 10/2007 | Kim et al. | 257/43 |
| 2007/0267633 | A1* | 11/2007 | Park et al. | 257/59 |
| 2007/0272922 | A1* | 11/2007 | Kim et al. | 257/43 |
| 2007/0275512 | A1* | 11/2007 | Jee et al. | 438/149 |
| 2007/0297039 | A1* | 12/2007 | Lee et al. | 359/296 |
| 2008/0023703 | A1* | 1/2008 | Hoffman et al. | 257/59 |
| 2008/0158108 | A1* | 7/2008 | Hwang et al. | 345/76 |
| 2008/0296568 | A1* | 12/2008 | Ryu et al. | 257/43 |
| 2009/0174012 | A1* | 7/2009 | Iwasaki | 257/410 |

FOREIGN PATENT DOCUMENTS

| | | |
|---|---|---|
| KR | 2005-46954 | 5/2005 |
| KR | 2006-7984 | 1/2006 |
| KR | 10-2007-0035373 | 3/2007 |

OTHER PUBLICATIONS

Office Action issued Oct. 7, 2009, in corresponding Korean Application No. 10-2007-0133508.

* cited by examiner

METHOD OF MANUFACTURING THIN FILM TRANSISTOR AND METHOD OF MANUFACTURING ORGANIC LIGHT EMITTING DISPLAY HAVING THIN FILM TRANSISTOR

CROSS-REFERENCE TO RELATED APPLICATION

This application claims the benefit of Korean Patent Application No. 2007-133508 filed on Dec. 18, 2007 in the Korean Intellectual Property Office, the entire content of which is incorporated herein by reference.

BACKGROUND OF THE INVENTION

1. Field of the Invention

Aspects of the present invention relate to a method of manufacturing a thin film transistor and a method of manufacturing an organic light emitting display having the thin film transistor, and more particularly to a method of manufacturing a thin film transistor having a compound semiconductor containing oxygen as a semiconductor layer and a method of manufacturing an organic light emitting display having the thin film transistor.

2. Description of the Related Art

Generally, a thin film transistor includes a semiconductor layer including a channel region and source and drain regions, and a gate electrode formed on the channel region and electrically insulated from the semiconductor layer by a gate insulating layer. The semiconductor layer of the thin film transistor configured as above is generally formed of amorphous silicon or poly-silicon. However, if the semiconductor layer is formed of amorphous silicon, charge mobility in the semiconductor layer is low and causes difficulties in implementing a driving circuit to be operated at high speeds. If the semiconductor is formed of the poly-silicon, charge mobility in the semiconductor layer is high whereas threshold voltage in the semiconductor layer becomes uneven and results in additional use of a separate compensation circuit.

Also, a method of manufacturing a typical thin film transistor using low temperature poly-silicon (LTPS) involves high-cost processes such as laser annealing, etc., and control of its property is difficult, and leads to a difficulty in applying the technique to a large area substrate.

In view of the above problems, a study is under way to use the compound semiconductor as the semiconductor layer. Japanese Patent Publication No. 2004-273614 discloses a thin film transistor using zinc oxide (ZnO) or a compound semiconductor using zinc oxide (ZnO) as a main ingredient as the semiconductor layer.

However, if the compound semiconductor is used as the semiconductor layer, a problem arises in that conductivity is reduced due to infiltration of hydrogen (H) when exposed to air. The hydrogen infiltrated into a surface part of the compound semiconductor layer acts as a shallow donor to reduce the conductivity of the semiconductor layer, and such a reduction of the conductivity intensifies according to the exposed time thereof. Therefore, owing to the reduction of the conductivity on the channel region, the electrical property of the thin film transistor is deteriorates, thereby leading to an increase in a leakage current, etc.

Regarding the reduction of the conductivity of the semiconductor layer due to infiltration of hydrogen, a thesis titled, "Role of Intentionally Incorporated Hydrogen I Wide-Band-Gap ZnO Thin Film Prepared by Photo-MOCVD Technique", cP772, *Physics of Semiconductors;* 27th *International Conference on the Physics of Semiconductors* may be referred to.

SUMMARY OF THE INVENTION

Therefore, aspects of the present invention include a method of manufacturing a thin film transistor capable of preventing or reducing an electrical property change of a semiconductor layer due to diffusion (infiltration) of hydrogen ions and a method of manufacturing an organic light emitting display having the thin film transistor.

Another aspect of the present invention includes a method of manufacturing a thin film transistor having improved electrical property and reliability, and a method of manufacturing an organic light emitting display having the thin film transistor.

An aspect of the present invention includes a method of manufacturing a thin film transistor, including: forming a gate electrode on an insulating substrate; forming a gate insulating layer on the gate electrode; forming a semiconductor layer including oxygen ions on the gate insulating layer, and including a channel region, a source region, and a drain region; forming a source electrode and a drain electrode to contact the semiconductor layer in the source region and the drain region, respectively; and forming a passivation layer on the semiconductor layer by coating a material, wherein a carrier density of the semiconductor layer is 1E+17 to 1E+18/cm$^3$.

An aspect of the present invention includes a method of manufacturing a thin film transistor, including: forming a gate electrode on an insulating substrate; forming a gate insulating layer on the gate electrode; forming a semiconductor layer including oxygen ions, on the gate insulating layer, and including a channel region, a source region, and a drain region; forming a passivation layer on the semiconductor layer by coating a material; forming a photoresist film on the passivation layer and then patterning the photoresist film to expose the source region and drain region of the semiconductor layer; and forming a source electrode and a drain electrode to contact the semiconductor layer in the source region and the drain region, respectively, wherein a carrier density of the semiconductor layer is 1E+17 to 1E+18/cm$^3$.

An aspect of the present invention includes a method of manufacturing an organic light emitting display having a thin film transistor, including: forming a gate electrode on an insulating substrate; forming a gate insulating layer on the gate electrode; forming a semiconductor layer including oxygen ions on the gate insulating layer, and including a channel region, a source region, and a drain region; forming a passivation layer on the semiconductor layer by coating a material; forming a photoresist film on the passivation layer and then patterning the photoresist film to expose the source region and drain region of the semiconductor layer; forming a source electrode and a drain electrode to contact the semiconductor layer in the source region and the drain region, respectively; forming a planarization layer over the source electrode or the drain electrode and patterning the planarization layer to expose the source electrode or the drain electrode; forming a first electrode to contact the source electrode or the drain electrode exposed on the planarization layer; forming a pixel definition layer over the first electrode and exposing the first electrode in the light emitting region; and forming an organic thin film layer on the exposed first electrode and forming a second electrode on the pixel definition layer including the organic thin film layer, wherein a carrier density of the semiconductor layer is 1E+17 to 1E+18/cm$^3$.

An aspect of the present invention includes a thin film transistor, including: a substrate; a compound semiconductor layer formed over the substrate, and including a channel region, a source region, and a drain region; a gate electrode formed to correspond to the channel region; and a passivation layer over the substrate and the thin film transistor to seal the compound semiconductor from intrusion of hydrogen.

An aspect of the present invention includes a method of manufacturing a thin film transistor, including: forming the thin film transistor on a substrate, the thin film transistor including a compound semiconductor layer comprising a channel region, a source region, and a drain region; and forming a passivation layer over the substrate and the thin film transistor to seal the compound semiconductor from intrusion of hydrogen.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the aspects, taken in conjunction with the accompanying drawings of which.

DETAILED DESCRIPTION OF THE EMBODIMENTS

Figure 1:
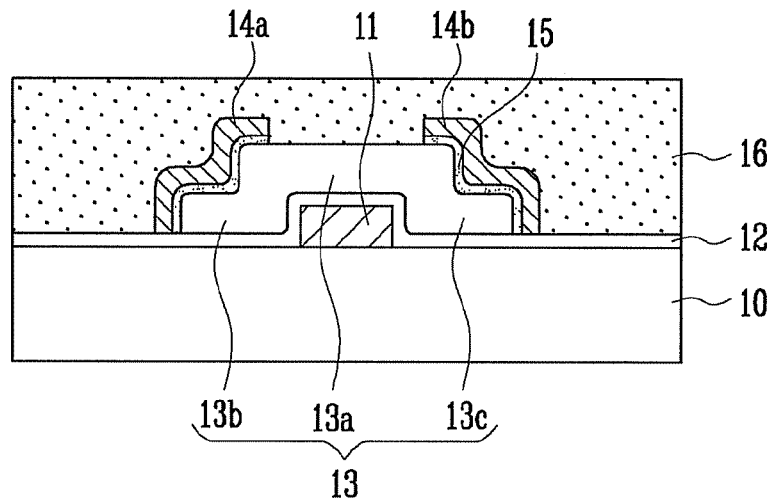
FIG. 1 is a cross-sectional view explaining a thin film transistor according to a first aspect of the present invention.

Reference will now be made in detail to aspects of the present invention, examples of which are illustrated in the accompanying drawings, wherein like reference numerals refer to the like elements throughout. The aspects are described below in order to explain the present invention by referring to the figures.

Hereinafter, certain aspects according to the present invention will be described with reference to the accompanying drawings. Here, when a first element is described as being coupled to a second element, the first element may be not only directly coupled to the second element but may also be indirectly coupled to the second element via a third element. Further, some of the elements that are not essential to the complete understanding of the invention are omitted for clarity.

FIG. 1 is a cross-sectional view explaining a thin film transistor according to a first aspect of the present invention, wherein the thin film transistor having a bottom gate structure is shown, as an example. As shown in FIG. 1, a gate electrode 11 is formed on a substrate 10 formed of insulating material. A gate insulating layer 12 is formed on an entire upper surface of the substrate 10 including the gate electrode 11. A semiconductor layer 13 is formed on the gate electrode 11, is electrically insulated from the gate electrode 11, and includes a channel region 13a, a source region 13b, and a drain region 13c. The semiconductor layer 13 is formed of a compound semiconductor including oxygen ions, wherein the channel region 13a is formed to be overlapped with the gate electrode 11. As the compound semiconductor including oxygen ions, zinc oxide (ZnO) or a compound semiconductor, etc., using zinc oxide (ZnO) doped with gallium (Ga), indium (In), tin (Sn), etc., as a main ingredient, may be used.

A source electrode 14a and a drain electrode 14b are formed on the semiconductor layer 13 to correspond to the source and drain regions 13b and 13c. Herein, a conductive layer 15 to reduce a contact resistance between the source and drain electrodes 14a and 14b, and the semiconductor layer 13 may be formed therebetween. Also, a passivation layer 16 is formed over the source and drain electrodes 14a and 14b and the semiconductor layer 13. In aspects of the present invention, the passivation layer 16 is formed of at least one material selected from the group consisting of polyimide, polyacryl, spin on glass (SOG), photoresist film, and benzocyclobutane (BCB). In aspects of the present invention, the passivation layer 16 entirely covers the semiconductor layer 13 and the source and drain electrodes 14a and 14b to seal them. Accordingly, the passivation layer 16 prevents or reduces infiltration of hydrogen into the semiconductor layer 13.

Figure 2:
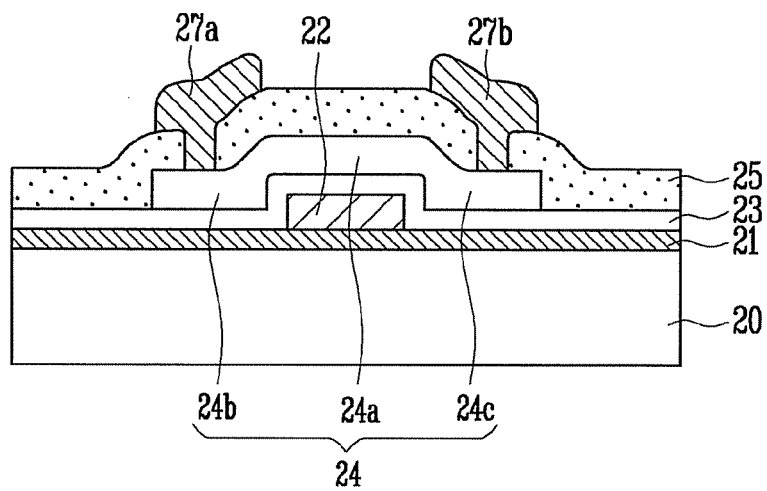
FIG. 2 is a cross-sectional view explaining a thin film transistor according to a second aspect of the present invention.

FIG. 2 is a cross-sectional view explaining a thin film transistor according to a second aspect of the present invention, wherein the thin film transistor having a bottom gate structure is shown, as an example. As shown in FIG. 2, a buffer layer 21 is formed on a substrate 20 formed of insulating material, and a gate electrode 22 is formed on the buffer layer 21. A semiconductor layer 24 is formed on the gate electrode 22, is electrically insulated from the gate electrode 22 by a gate insulating layer 23, and includes a channel region 24a, a source region 24b, and a drain region 24c. The semiconductor layer 24 is formed of a compound semiconductor including oxygen ions, wherein the channel region 24a is formed to be overlapped with the gate electrode 22. As the compound semiconductor including oxygen ions, zinc oxide (ZnO) or a compound semiconductor, etc., using zinc oxide (ZnO) doped with gallium (Ga), indium (In), tin (Sn), etc., as a main ingredient, may be used.

A passivation layer 25 is formed on the entire semiconductor layer 24, and is formed with contact holes to expose the source and drain regions 24b and 24c. The passivation layer 25 is formed of at least one material selected from the group consisting of polyimide, polyacryl, spin on glass (SOG), photoresist film, and benzocyclobutane (BCB). Source and drain electrodes 27a and 27b are formed on the passivation layer 25, and are contacted to the respective source and drain regions 24b and 24c through the contact holes. In aspects of the present invention, the passivation layer 25 entirely covers the semiconductor layer 24 and the source and drain electrodes 27a and 27b to seal them. Accordingly, the passivation layer 25 prevents or reduces infiltration of hydrogen into the semiconductor layer 24.

Figure 3A:
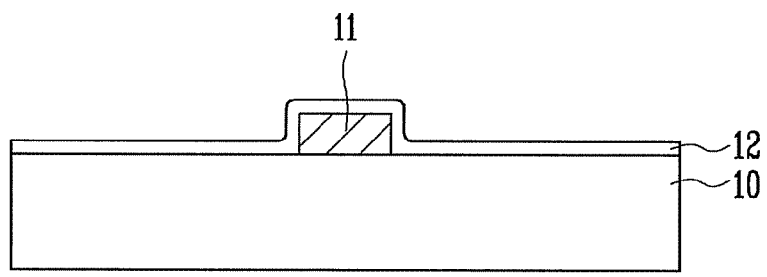
FIGS. 3A to 3D are cross-sectional views explaining a method of manufacturing a thin film transistor according to the first aspect of the present invention.

FIGS. 3A to 3D are cross-sectional views explaining a method of manufacturing a thin film transistor according to the first aspect of the present invention. Referring to FIG. 3A, a gate electrode 11 is formed on an insulating substrate 10, and then, a gate insulating layer 12 is formed on an entire upper surface of the substrate 10 including the gate electrode 11.

Figure 3B:
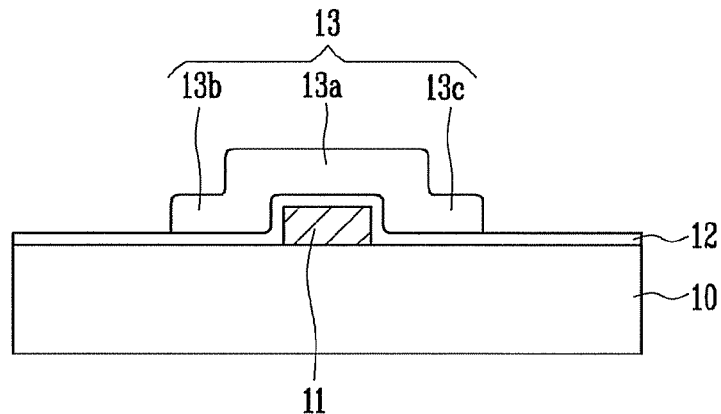

Referring to FIG. 3B, a semiconductor layer 13 is formed on the gate insulating layer 12, and over the gate electrode 11. The semiconductor layer 13 includes a channel region 13a, a source region 13b, and a drain region 13c. The semiconductor layer 13 is a compound semiconductor including oxygen ions, wherein the semiconductor layer 13 may be formed of zinc oxide (ZnO) or a compound semiconductor, etc., using zinc oxide (ZnO) doped with gallium (Ga), indium (In), tin (Sn), etc., as a main ingredient.

Figure 3C:
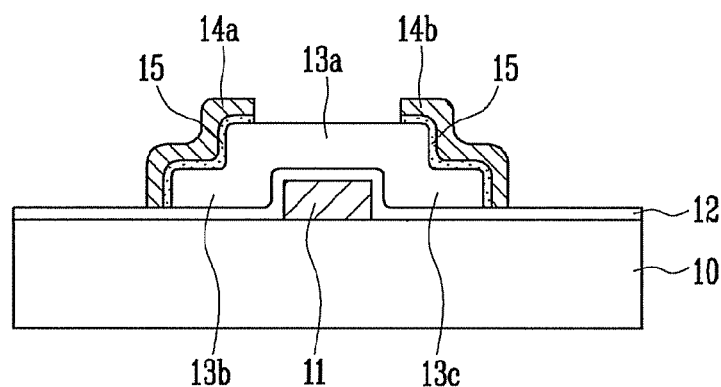

Referring to FIG. 3C, metal is deposited and then patterned on an entire upper surface of the semiconductor layer 13 to form source and drain electrodes 14a and 14b that contact the respective source and drain regions 13b and 13c of the semiconductor layer 13. At this time, a conductive layer 15 to reduce a contact resistance between the source and drain electrodes 14a and 14b, and the semiconductor layer 13 may further be formed therebetween.

Figure 3D:
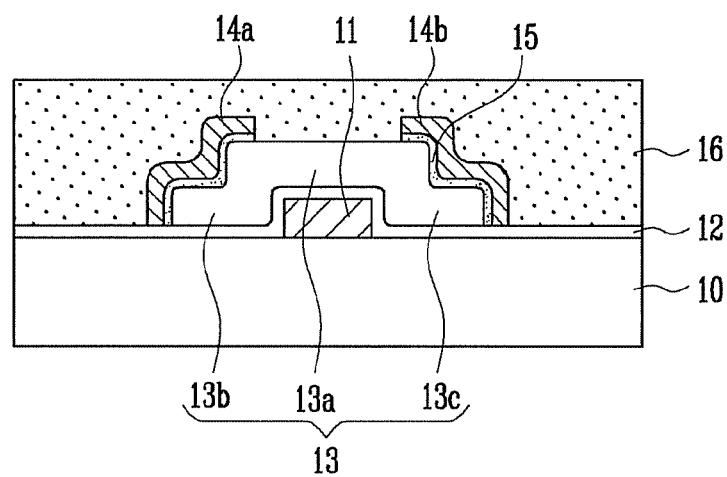

Referring to FIG. 3D, a passivation layer 16 is formed on an entire surface of the source and drain electrodes 14a and 14b, and that of the semiconductor layer 13 by performing a spin coating or a slit coating thereon of at least one material selected from the group consisting of polyimide, polyacryl, spin on glass (SOG), photoresist film, and benzocyclobutane (BCB). At this time, the organic material may be cured after being coated.

Figure 4A:
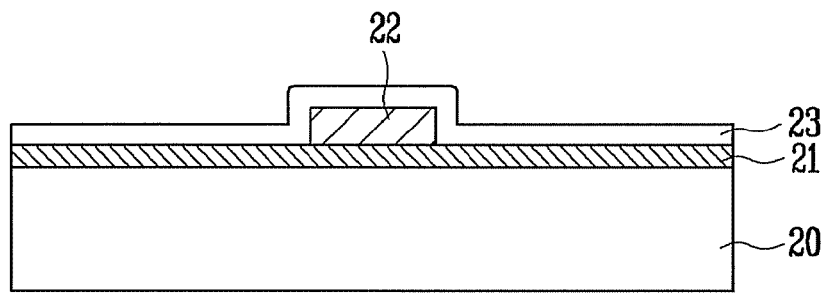
FIGS. 4A to 4E are cross-sectional views explaining a method of manufacturing a thin film transistor according to the second aspect of the present invention.

FIGS. 4A to 4E are cross-sectional views explaining a method of manufacturing a thin film transistor according to the second aspect of the present invention. Referring to FIG. 4A, a gate electrode 22 is formed on or over an insulating substrate 20, and then, a gate insulating layer 23 is formed on the gate electrode 22 and over the insulating substrate 20. At this time, a buffer layer 21 may be formed on the insulating substrate 20 before the gate electrode 22 is formed. The buffer layer 21 may be formed of an insulating material such as silicon oxide or silicon nitride.

Figure 4B:
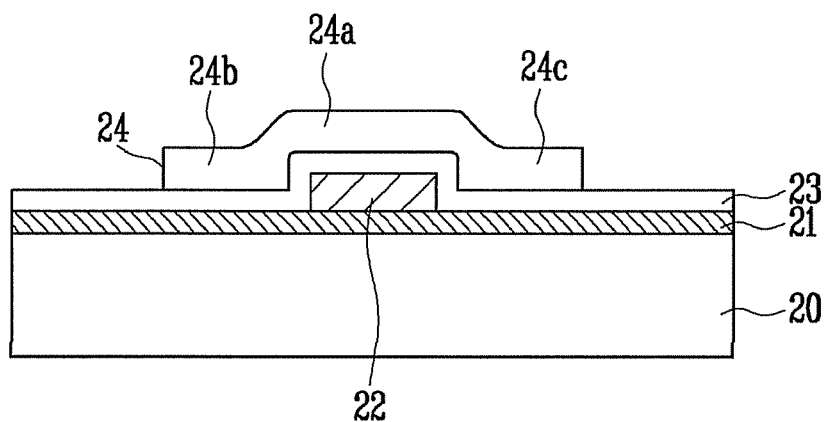

Referring to FIG. 4B, a semiconductor layer 24 is formed on the gate insulating layer 23 that covers the gate electrode 22. The semiconductor layer 24 includes a channel region 24a, a source region 24b, and a drain region 24c. The semiconductor layer 24 is a compound semiconductor including oxygen ions, and may be formed of zinc oxide (ZnO) or a compound semiconductor, etc., using zinc oxide (ZnO) doped with gallium (Ga), indium (In), tin (Sn), etc., as a main ingredient.

Figure 4C:
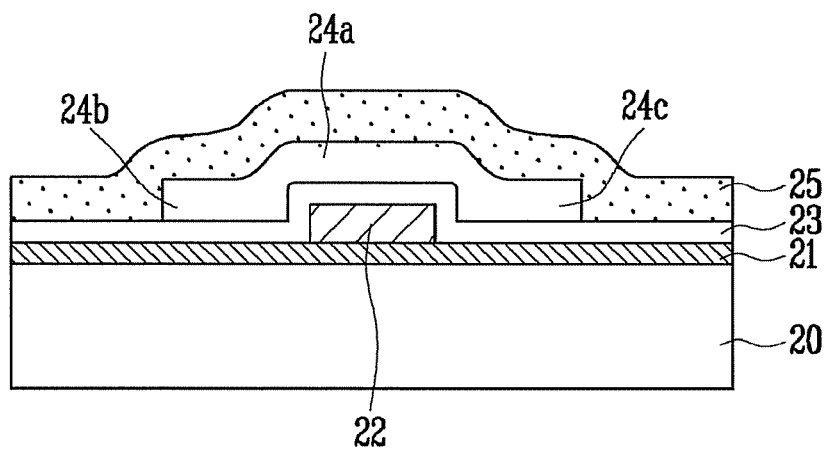

Referring to FIG. 4C, a passivation layer 25 is formed on an entire surface of the semiconductor layer 24 by performing a spin coating or a slit coating thereon of at least one material selected from the group consisting of polyimide, polyacryl, spin on glass (SOG), photoresist film, and benzocyclobutane (BCB).

Figure 4D:
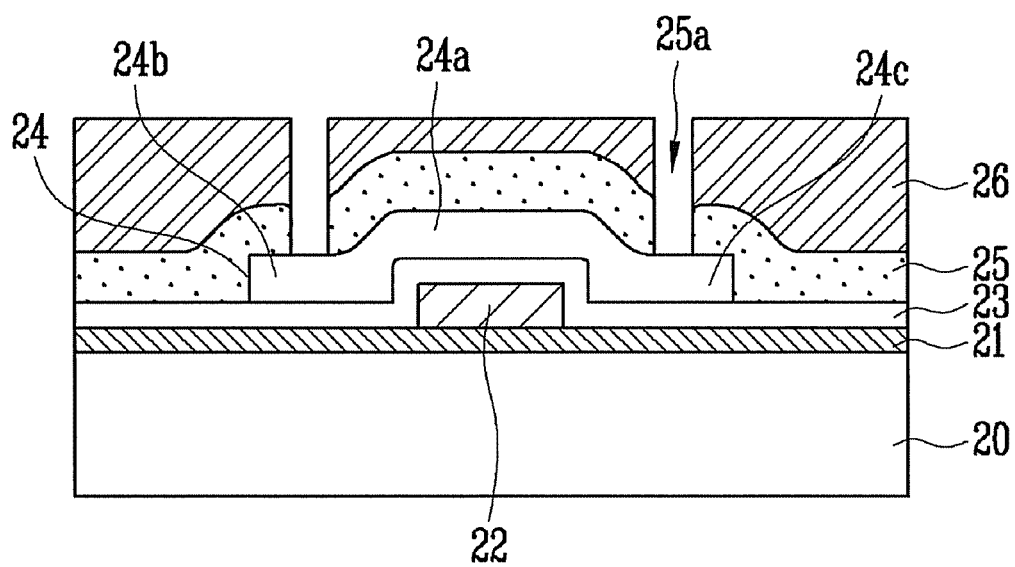

Referring to FIG. 4D, a photoresist film 26 is formed and then patterned on the passivation layer 25. The passivation layer 25 in the exposed portion is etched through an etching process using the patterned photoresist film 26 as a mask. Accordingly, contact holes 25a are formed to expose predetermined portions of the source region 24b and the drain region 24c. At this time, the photoresist film 26 can be patterned through exposure and development processes using an established mask.

Figure 4E:
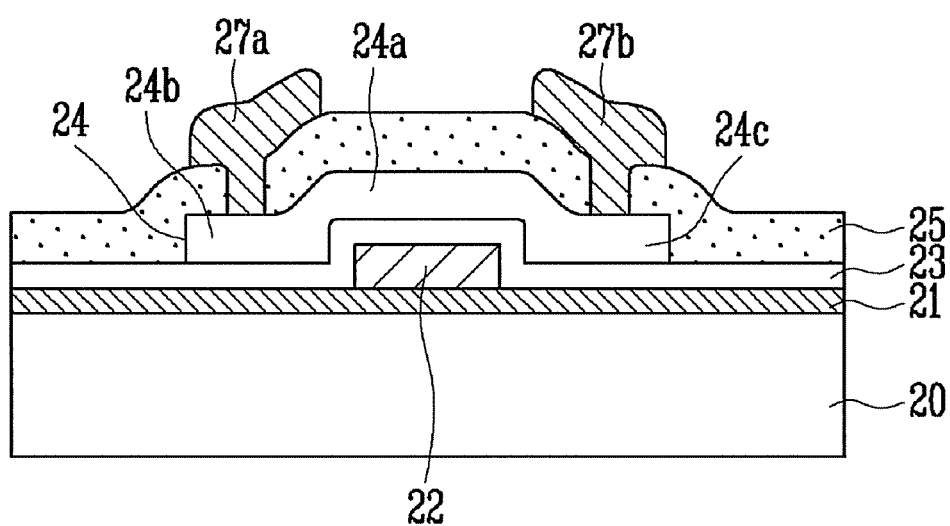

Referring to FIG. 4E, source and drain electrodes 27a and 27b are formed to be contacted to the source and drain regions 24b and 24c of the semiconductor layer 24 through the contact holes 25a formed on the passivation layer 25.

Although the first and second aspects are described as having a spin coating or a slit coating thereon of a material, by way of example, any physical coating method that does not cause a reaction between materials may also be applied. Also, any material that can be patterned through a photolithography process using the photoresist film 26 can be used in addition to the noted materials.

As shown in the first and second aspects of the present invention, the passivation layers 16 and 25 are formed by coating, for example, an organic material, such is not required. Thus, the passivation layers 16 and 25 may be formed by depositing inorganic materials, such as, silicon oxide $SiO_2$, silicon nitride SiN, or the like, with plasma deposition equipment. However, as hydrogen (H) ions are diffused (infiltrated) into the semiconductor layer to be reacted during the deposition process, a hydrogen density and composition ratio of the semiconductor layer may be changed due to damage by the plasma.

In other words, if hydrogen (H) included in silan ($SiH_4$) gas (used as a precursor in the deposition process) is diffused (infiltrated) into the semiconductor layer, a carrier density of the semiconductor layer may increase by ~1E+20/$cm^3$ due to the increase of the hydrogen density, and the composition ratio of positive ions and negative ions may be changed due to the damage by the plasma.

For example, when the semiconductor layer is formed of InGaZnO, the ratio (composition ratio) of positive ions and negative ions of InGaZnO may be represented as $In_xGa_yZn_{1-x-y}O_z$. At this time, the semiconductor layer has an intrinsic property in case of $x+y+z=1$, while the semiconductor layer is conducting in the following case, wherein the composition ratio of positive ions and negative ions of ZnO may be changed as follows:

$$Zn_1O_{0.99}=10^{23} \times 0.01 \sim 10^{21}/cm^3$$

$$Zn_1O_{0.999}=10^{23} \times 0.001 \sim 10^{20}/cm^3$$

$$Zn_1O_{0.9999}=10^{23} \times 0.0001 \sim 10^{19}/cm^3$$

Therefore, if the composition of positive ions and negative ions is changed, a conductivity of a channel is changed due to a composition difference in the semiconductor layer as shown in the following mathematical equation 1.

$$\frac{z}{x+y+(1-x-y)} \geq 0.001 \qquad \text{[Mathematical Equation 1]}$$

Similar damage due to the plasma also appears in the process to pattern the passivation layer through a plasma etching process.

On the other hand, when the passivation layers 16 and 25 are formed by coating the organic material through a physical method according to aspects of the present invention, because only the physical method is used, the reaction with hydrogen does not occur. Also, as the plasma is not used, it is possible to prevent or reduce the damage due to the plasma. Therefore, in aspects of the present invention, the carrier density of the semiconductor layer can be stably maintained in a range from about 1E+17 to 1E+18/$cm^3$ and the conductivity of the channel is not changed even with a composition difference as shown in the following mathematical equation 2. The carrier density of the semiconductor layer between about 1E+19 and 1E+20 $cm^3$ allows the semiconductor layer to have a conductivity similar to that of metal, while the carrier density of the semiconductor layer less than 1E+15 $cm^3$ allows the semiconductor layer to have insulative properties.

$$\frac{z}{x+y+(1-x-y)} \leq 0.001 \quad \text{[Mathematical Equation 2]}$$

Figure 5A:
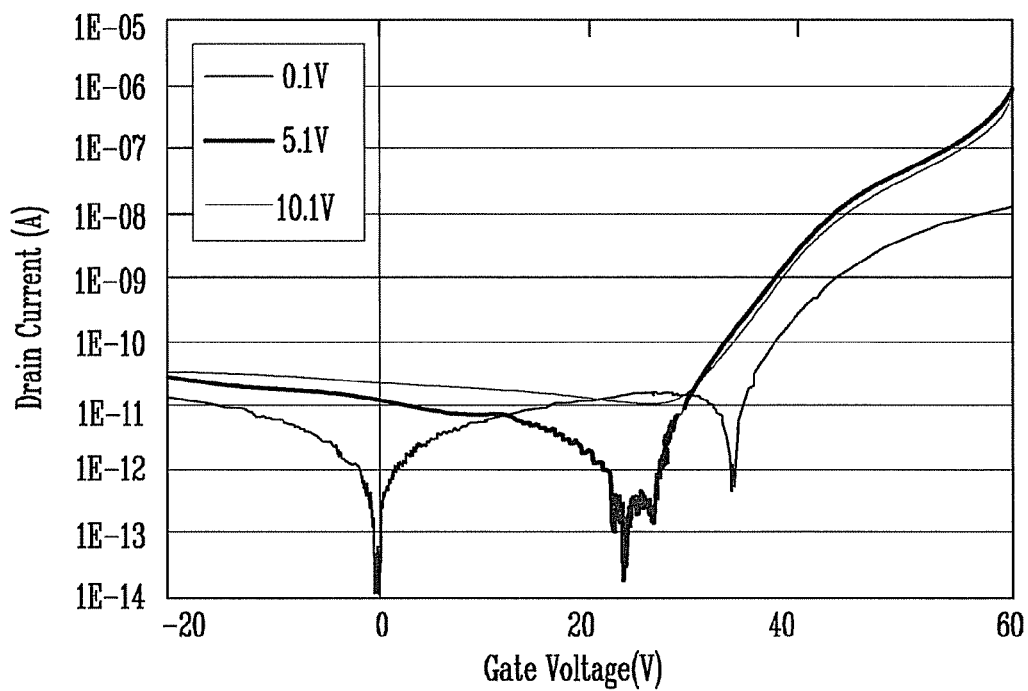
FIGS. 5A and 5B are graphs explaining electrical property of a thin film transistor according to aspects of the present invention.

FIG. 5A shows a transfer curve measurement of an electrical property of a thin film transistor to which a plasma enhanced chemical vapor deposition (PECVD) process and a dry etching process have been applied, and having a passivation layer formed with silicon nitride film SiN. Referring to FIG. 5A, it can be seen that a carrier density of a semiconductor layer changes for being exposed to hydrogen and being damaged by plasma during processing using silan ($SiH_4$), etc., to result in changes in a conductivity thereof.

Figure 5B:
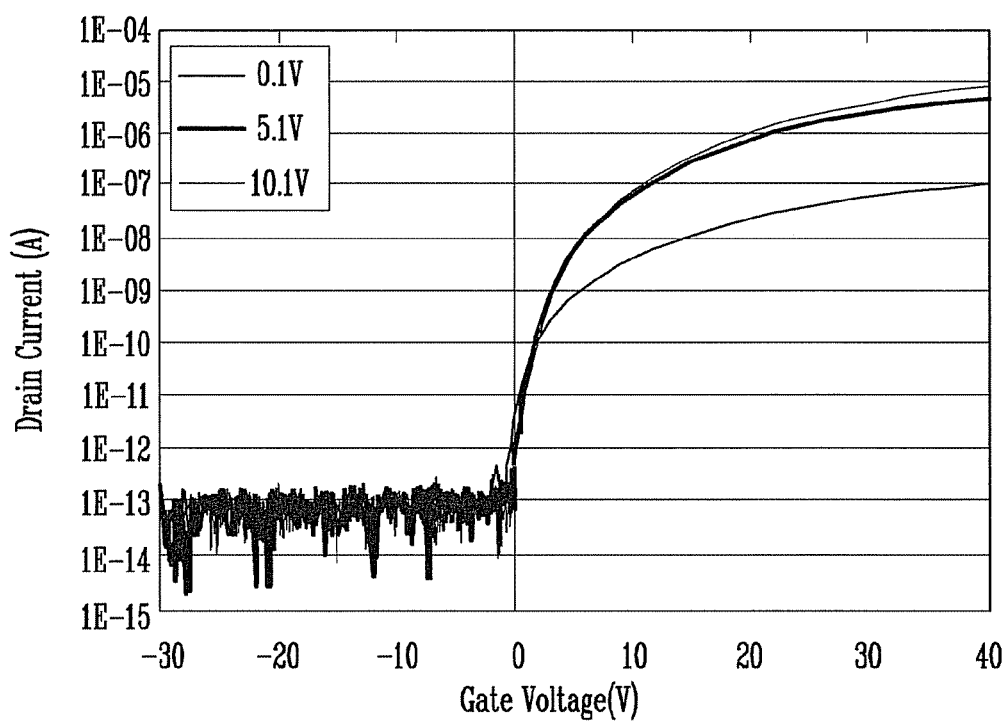

On the other hand, FIG. 5B shows a transfer curve measurement of an electrical property of a thin film transistor to which a spin coating process and a photolithography process have been applied, and having a passivation layer formed with organic material. Referring to FIG. 5B, since a physical method, such as the spin coating process, is used that does not expose a semiconductor layer to hydrogen and does not generate a reaction between materials, and a photolithography process is used that does not cause plasma damage, it can be seen that a carrier density of the semiconductor layer is not changed, and thus a conductivity thereof is not changed.

Also, aspects of the present invention uses the photolithography process that uses a photoresist film to pattern the passivation layers 16 and 25, in order to expose the respective source electrodes 14a and 27a and drain electrodes 14b and 27b. Therefore, the photolithography process prevents or reduces damage to the passivation layers 16 and 25 arising from plasma etching even in subsequent processes, making it possible to effectively and uniformly maintain the conductivity of the channel.

The first and second aspects of the present invention describe a thin film transistor having a bottom gate structure. However, aspects of the present invention can also be applied to a thin film transistor having any structures using a compound semiconductor, such as a top gate structure, etc., as a semiconductor layer.

Figure 6A:
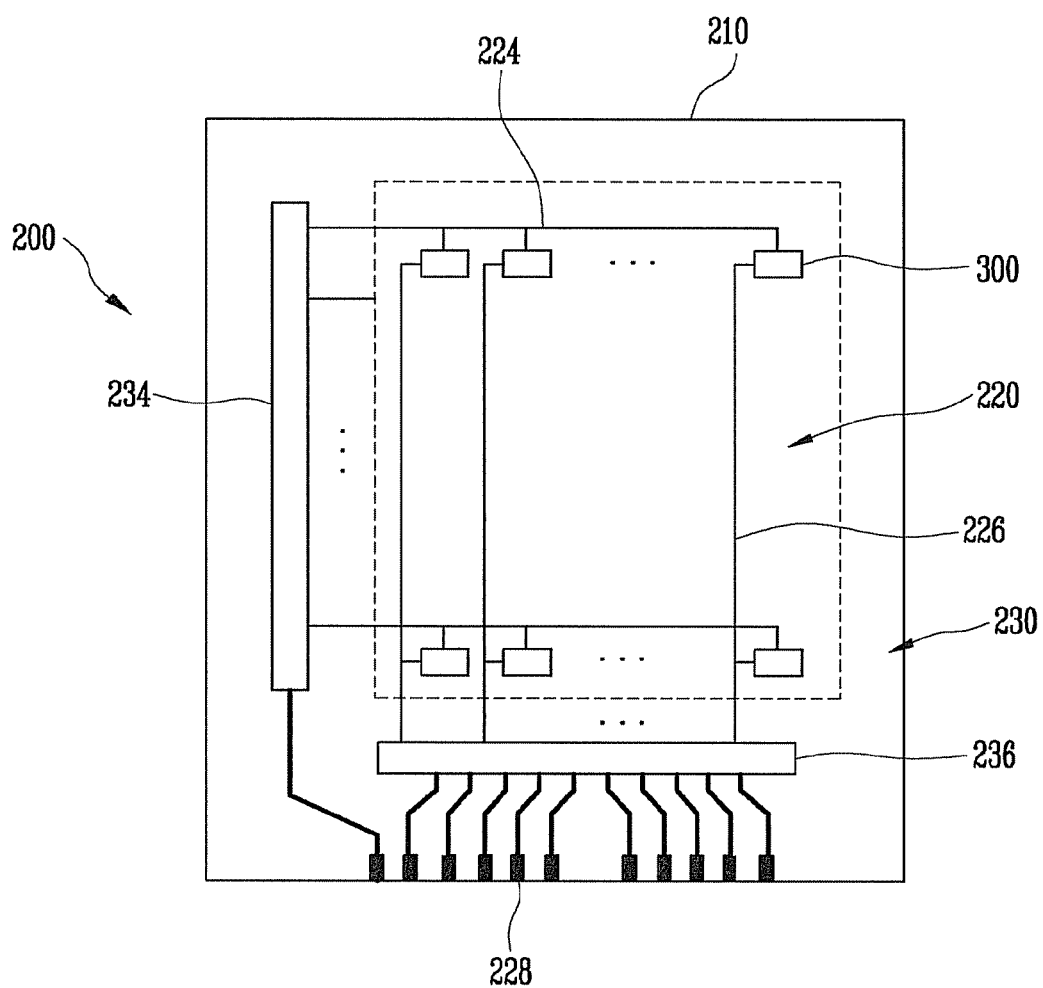
FIGS. 6A and 6B are a plan view and a cross-sectional view explaining a method of manufacturing an organic light emitting display having a thin film transistor according to aspects of the present invention.

FIG. 6A is a plan view explaining an organic light emitting display having a thin film transistor according to an aspect of the present invention. FIG. 6A will be schematically explained focused on a display panel 200 displaying an image. Referring to FIG. 6A, a substrate 210 includes a pixel region 220, and a non-pixel region 230 that is peripheral to the pixel region 220. A portion of the substrate 210 corresponding to the pixel region 220 includes a plurality of organic light emitting elements 300 that are coupled between scan lines 224 and data lines 226 in a matrix arrangement. A portion of the substrate 210 corresponding to the non-pixel region 230 is formed with portions of the scan lines 224 and data lines 226 that extend from the scan lines 224 and data lines 226 of the pixel region 220, power supply lines (not shown) used in the operation of the organic light emitting elements 300, and a scan driver 234 and a data driver 236 to process signals supplied from an external device through a pad 228 and to supply the process signals to the scan lines 224 and the data lines 226.

Figure 7:
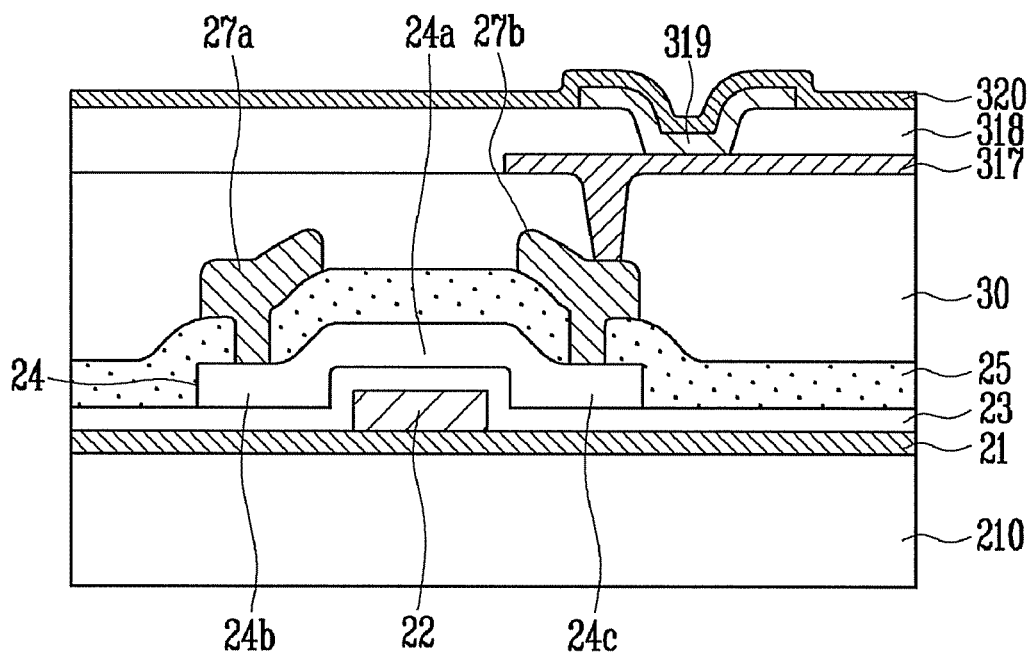
FIG. 7 is a cross-sectional view explaining a method of manufacturing an organic light emitting display having a thin film transistor according to an aspect of the present invention.

FIG. 7 is a cross-sectional view explaining a method of manufacturing an organic light emitting display having a thin film transistor according to an aspect of the present invention. Referring to FIG. 7, an organic light emitting element 300 is formed of an anode electrode 317, a cathode electrode 320, and an organic thin film layer 319 formed between the anode electrode 317 and the cathode electrode 320. The organic thin film layer 319 may include a hole transport layer, an organic light emitting layer, and an electron transport layer. In aspects of the present invention, the organic thin film layer 319 may further include a hole injection layer and an electron injection layer. Also, a capacitor to maintaining signals and a thin film transistor to control an operation of the organic light emitting element 300 may further be included.

The organic light emitting element 300 including the thin film transistor will be described in more detail with reference to FIGS. 6A and 7. The thin film transistor has the structure as shown in FIG. 1 or in FIG. 2. Such a thin film transistor can be manufactured according to a manufacturing method of aspects of the present invention with reference to FIGS. 3A to 3D or FIGS. 4A to 4E. For this discussion, a thin film transistor having a structure as shown in FIG. 2 will be described by way of example.

Referring to FIGS. 6A, 7 and 4A, a buffer layer 21 is formed on a substrate 210, and a gate electrode 22 is formed on the buffer layer 21 in a pixel region 220. At this time, scan lines 224 coupled to the gate electrode 22 are formed in the pixel region 220. Scan lines 224 in the non-pixel region 230 are those that extend from the scan lines 224 in the pixel region 220, and a pad 228 to receive signals from the external device, may be formed in the non-pixel region 230. Thereafter, a gate insulating layer 23 is formed on the upper surface of the buffer layer 21 that includes the gate electrode 22.

Referring to FIGS. 7 and 4B, a semiconductor layer 24 (that includes a channel region 24a, a source region 24b, and a drain region 24c) is formed on the gate insulating layer 23 and the gate electrode 22. The semiconductor layer 24 is a compound semiconductor including oxygen ions, and may be formed of zinc oxide (ZnO) or a compound semiconductor, etc., that uses zinc oxide doped with gallium (Ga), indium (In) and tin (Sn), etc., as a main ingredient.

Referring to FIGS. 7 and 4C, a passivation layer 25 is formed over the entire semiconductor layer 24 and the gate insulating layer 23 by coating at least one material selected from the group consisting of polyimide, polyacryl, spin on glass (SOG), photoresist film, and benzocyclobutane (BCB).

Referring to FIGS. 7 and 4D, a photoresist film 26 is formed on the passivation layer 25, and then, the photoresist film 26 is patterned through an exposure process and development processes using an established mask. The passivation layer 25 in an exposed portion is etched through an etching process using the patterned photoresist film 26 as a mask. Thereby, contact holes 25a are formed to expose predetermined portions of a source region 24b and a drain region 24c.

Referring to FIGS. 7 and 4E, source and drain electrodes 27a and 27b are formed in order to contact the source and drain regions 24b and 24c of the semiconductor layer 24 through the contact holes 25a formed on a passivation layer 25. At this time, data lines 226 coupled to the source and drain electrodes 27a and 27b are formed in a pixel region 220. Data lines 226 in the non pixel region 230 are those that extend from the data lines 226 in the pixel region 220, and a pad 228 to receive signals from the external device may be formed in the non-pixel region 230.

Referring to FIG. 7, a planarization layer 30 is formed on an entire upper surface of the passivation layer 25, and the source and drain electrodes 27a and 27b to form a planar surface. A via hole is formed in the planarization layer 30 in order to expose a predetermined portion of the source electrode 27a or drain electrode 27b. Thereafter, an anode electrode 317 is formed and coupled to the source electrode 27a or the drain electrode 27b through the via hole.

Thereafter, a pixel definition layer 318 is formed on the planarization layer 30 to expose some region (a light emitting region) of the anode electrode 317, and an organic thin film layer 319 is formed on the exposed region of anode electrode 317. A cathode electrode 320 is formed on the pixel definition film 318 and the organic thin film layer 319.

Figure 6B:
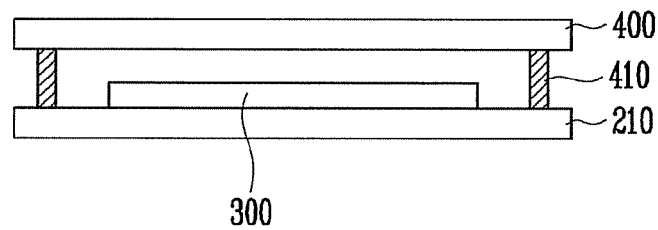

Referring to FIG. 6B, an encapsulation substrate 400 to encapsulate a pixel region 220 is disposed over the substrate 210 having the organic light emitting elements 300. The encapsulation substrate 400 is bonded to the substrate 210 by a sealing material 410 to complete a display panel 200.

As described above, aspects of the present invention form a passivation layer by coating organic material through a physical method, such as, a spin coating process where a reaction between materials does not occur, and patterns the passivation layer through a pattern process using a photoresist film. Accordingly, a change of a hydrogen density of a semiconductor layer, a change of composition ratio due to diffusion (infiltration) of hydrogen, and plasma damage are effectively prevented or reduced. Therefore, specific resistance in a channel region is controlled, conductivity in the channel region is stably maintained, making it possible to improve the electrical property of a thin film transistor, such as a non-generation of leakage current, etc.

In the figures, the dimensions of layers and regions may be exaggerated for clarity. It will also be understood that when a layer or element is referred to as being "on" or "over" another layer or substrate, it can be directly on the other layer or substrate, or intervening layers may also be present. Further, it will be understood that when a layer is referred to as being "under" or "below" another layer, it can be directly under, or one or more intervening layers may also be present.

Although a few aspects of the present invention have been shown and described, it would be appreciated by those skilled in the art that changes may be made in the aspects without departing from the principles and spirit of the invention, the scope of which is defined in the claims and their equivalents.

What is claimed is:

1. A method of manufacturing a thin film transistor comprising:
    forming a gate electrode on an insulating substrate;
    forming a gate insulating layer on the gate electrode;
    forming a semiconductor layer including oxygen ions on the gate insulating layer, the semiconductor layer including a channel region, a source region, and a drain region;
    forming a source electrode and a drain electrode to contact the semiconductor layer in the source region and the drain region, respectively; and
    forming a passivation layer directly on the semiconductor layer and directly on the source and drain electrodes by coating a material, wherein the material is coated through a slit coating method,
    wherein a carrier density of the semiconductor layer is 1E+17 to 1E+18/cm$^3$.

2. The method of manufacturing the thin film transistor as claimed in claim 1, wherein the semiconductor layer is formed of zinc oxide (ZnO).

3. The method of manufacturing the thin film transistor as claimed in claim 1, wherein the semiconductor layer is formed of zinc oxide (ZnO) doped with at least one of gallium (Ga), indium (In), and tin (Sn).

4. The method of manufacturing the thin film transistor as claimed in claim 1, wherein the material is at least one material selected from the group consisting of polyimide, polyacryl, spin on glass (SOG), photoresist film, and benzocyclobutane (BCB).

5. A method of manufacturing a thin film transistor comprising:
    forming a gate electrode on an insulating substrate;
    forming a gate insulating layer on the gate electrode;
    forming a semiconductor layer including oxygen ions on the gate insulating layer, the semiconductor layer including a channel region, a source region, and a drain region;
    forming a passivation layer directly on the semiconductor layer by coating a material, wherein the material is coated through a slit coating method;
    forming a photoresist film on the passivation layer and then patterning the photoresist film to expose the source region and drain region of the semiconductor layer; and
    forming a source electrode and a drain electrode to contact the semiconductor layer in the source region and the drain region, respectively,
    wherein a carrier density of the semiconductor layer is 1E+17 to 1E+18/cm$^3$.

6. The method of manufacturing the thin film transistor as claimed in claim 5, wherein the semiconductor layer is formed of zinc oxide (ZnO).

7. The method of manufacturing the thin film transistor as claimed in claim 5, wherein the semiconductor layer is formed of zinc oxide (ZnO) doped with at least one of gallium (Ga), indium (In), and tin (Sn).

8. The method of manufacturing the thin film transistor as claimed in claim 5, wherein the material is at least one material selected from the group consisting of polyimide, polyacryl, spin on glass (SOG), photoresist film, and benzocyclobutane (BCB).

9. A method of manufacturing an organic light emitting display comprising:
    forming a gate electrode on an insulating substrate;
    forming a gate insulating layer on the gate electrode;
    forming a semiconductor layer including oxygen ions on the gate insulating layer, the semiconductor layer including a channel region, a source region, and a drain region on the gate insulating layer;
    forming a passivation layer directly on the semiconductor layer by coating a material, wherein the material is coated through a slit coating method;
    forming a photoresist film on the passivation layer and then patterning the photoresist film to expose the source region and drain region of the semiconductor layer;
    forming a source electrode and a drain electrode to contact the semiconductor layer in the source region and the drain region, respectively;
    forming a planarization layer on the passivation layer, the source electrode, and the drain electrode, and patterning the planarization layer to expose the source electrode or the drain electrode;
    forming a first electrode on the planarization layer to contact the exposed source electrode or the drain electrode;
    forming a pixel definition layer on the planarization layer and the first electrode, and exposing the first electrode in a light emitting region thereof; and
    forming an organic thin film layer on the exposed first electrode and forming a second electrode on the pixel definition layer and the organic thin film layer,
    wherein a carrier density of the semiconductor layer is 1E+17 to 1E+18/cm$^3$.

10. The method of manufacturing the organic light emitting display as claimed in claim 9, wherein the semiconductor layer is formed of zinc oxide (ZnO).

11. The method of manufacturing the organic light emitting display as claimed in claim 9, wherein the semiconductor layer is formed of zinc oxide (ZnO) doped with at least one of gallium (Ga), indium (In), and tin (Sn).

12. The method of manufacturing the organic light emitting display as claimed in claim 9, wherein the material is at least one material selected from the group consisting of polyimide, polyacryl, spin on glass (SOG), photoresist film, and benzocyclobutane (BCB).

\* \* \* \* \*